United States Patent
Hu et al.

(10) Patent No.: US 12,141,505 B2
(45) Date of Patent: Nov. 12, 2024

(54) OPTIMIZATION METHOD OF SHIELD TUNNEL STARTING END REINFORCEMENT SOLUTION

(71) Applicant: HAINAN UNIVERSITY, Hainan (CN)

(72) Inventors: Jun Hu, Hainan (CN); Jianjian Zhan, Hainan (CN); Wenbo Liu, Hainan (CN); Lu Chen, Hainan (CN); Ming Xiong, Hainan (CN); Hongshuo Zhang, Hainan (CN); Zhixin Wang, Hainan (CN); Hui Zeng, Hainan (CN); Lin Jia, Hainan (CN)

(73) Assignee: HAINAN UNIVERSITY, Hainan (CN)

( * ) Notice: Subject to any disclaimer, the term of this patent is extended or adjusted under 35 U.S.C. 154(b) by 689 days.

(21) Appl. No.: 17/593,099

(22) PCT Filed: Jul. 14, 2021

(86) PCT No.: PCT/CN2021/106244
§ 371 (c)(1),
(2) Date: Sep. 9, 2021

(87) PCT Pub. No.: WO2022/236955
PCT Pub. Date: Nov. 17, 2022

(65) Prior Publication Data
US 2023/0367919 A1  Nov. 16, 2023

(30) Foreign Application Priority Data

May 13, 2021  (CN) .......................... 202110524167.8

(51) Int. Cl.
G06F 30/13  (2020.01)

(52) U.S. Cl.
CPC .................................. G06F 30/13 (2020.01)

(58) Field of Classification Search
CPC ....................................................... G06F 30/13
See application file for complete search history.

(56) References Cited

PUBLICATIONS

Huang S, Guo Y, Liu Y, Ke L, Liu G. Study on the influence of water flow on temperature around freeze pipes and its distribution optimization during artificial ground freezing. Applied Thermal Engineering. May 5, 2018;135:435-45. (Year: 2018).*

(Continued)

Primary Examiner — Chuen-Meei Gan
(74) Attorney, Agent, or Firm — WELSH FLAXMAN & GITLER LLC

(57) ABSTRACT

An optimization method of shield tunnel starting end reinforcement solution, which specifically includes the following steps: acquiring shield tunnel engineering data and temperature variation curves of thermometer holes; constructing a numerical model with thermal convection and a hydro-thermal coupling numerical model respectively according to the shield tunnel engineering data, wherein a first temperature variation curve and a second temperature variation curve can be obtained after carrying out numerical simulations on the above two models; the influence of seepage on the development law of a temperature field can be obtained by comparing and analyzing the temperature variation curves of the thermometer holes with the first and the second temperature variation curves; and finally the existing freezing solution of the shield tunnel is optimized according to the influence of the seepage on the development law of the temperature field, to ensure safe use of the shield tunnel.

7 Claims, 10 Drawing Sheets

(56) References Cited

PUBLICATIONS

Vitel M, Rouabhi A, Tijani M, Guerin F. Modeling heat transfer between a freeze pipe and the surrounding ground during artificial ground freezing activities. Computers and Geotechnics. Jan. 1, 2015;63:99-111. (Year: 2015).*

Zhang S, Yue ZR, Sun TC, Zhang JW, Su YL. Evolution of ground freezing temperature field under sudden seepage with stable flow rate and discriminate method of seepage. China Coal Soc. 2020;45:4017-27. (Year: 2020).*

* cited by examiner

OPTIMIZATION METHOD OF SHIELD TUNNEL STARTING END REINFORCEMENT SOLUTION

FIELD OF THE INVENTION

The present invention relates to the technical field of shield construction, in particular to an optimization method of shield tunnel starting end reinforcement solution.

BACKGROUND OF THE INVENTION

With the rapid development of underground space, large-diameter shield tunnel projects are increasing, especially the construction of cross-sea and cross-river tunnels, and the risk of large-diameter inlet and outlet caves of tunnel shield increases gradually as an end face of the shield tunnel expands, so soil mass reinforcement for the shield tunnel starting end becomes a crucial part; most of the existing shield reinforcement solutions are optimized at any time during the process of construction according to field data, for example, in a patent of construction method for settlement control of a large-diameter slurry shield crossing shantytowns by long distance under an unreinforced condition with a publication number CN108533277B, which includes following three steps: preparation measures before the shield crosses; construction control measures of the shield crossing shantytowns; settlement control measures after the shield crosses, which are optimized and adjusted according to a correlation between shield tunneling parameters and ground surface settlement in the shield tunneling stage included in the preparation measures before the shield crosses; in a patent of all-inclusive horizontal freezing method of an end soil mass reinforcement shield entry tunnel construction method with a publication number of CN104653189A, which includes two steps of environmental analysis and solution optimization, and the solution optimization is also carried out in the construction process; the above two patents only carry out optimization in the construction process, without checking whether the shield solution is reasonable after the construction is completed, so it is impossible to optimize the shield project to ensure the safe use of the shield tunnel.

BRIEF SUMMARY OF THE INVENTION

In view of this, provided is an optimization method of the shield tunnel starting end reinforcement solution, which carries out analysis and modeling according to the data of the existing shield tunnel, and optimizes the freezing solution of the current shield tunnel through the set model.

The technical solution of the present invention is realized as follows:

an optimization method of shield tunnel starting end reinforcement solution, including the following steps:
step S1, acquiring the shield tunnel engineering data and the temperature variation curves of thermometer holes;
step S2, constructing a numerical model with thermal convection according to the shield tunnel engineering data, and obtaining a first temperature variation curve according to the numerical model with thermal convection;
step S3, constructing a hydro-thermal coupling numerical model according to the shield tunnel engineering data, and obtaining a second temperature variation curve according to the hydro-thermal coupling numerical model;
step S4, comparing the temperature variation curves of the thermometer holes, the first temperature variation curve and the second temperature variation curve to obtain influence of seepage on the development law of a temperature field; and
step S5, optimizing a freezing solution according to the influence of seepage on the development law of the temperature field.

Preferably, the said shield tunnel engineering data in the step S1 includes an arrangement of freezing pipes, spacing between different rows of freezing pipes, spacing between freezing pipe holes in the same row, a distance between the freezing pipes and a diaphragm wall, diameters and lengths of the freezing pipes, diameters and lengths of temperature tubes and depths of the thermometer holes.

Preferably, specific steps of the said step S2 are:
step S21, setting constraint conditions;
step S22, establishing a geometric model according to the shield tunnel engineering data and carrying out a mesh subdivision;
step S23, selecting material parameters, determining load and boundary condition parameters;
step S24, acquiring the first temperature variation curve of simulated thermometer holes in the numerical model with thermal convection corresponding to actual thermometer holes selected for the temperature variation curves of the thermometer holes.

Preferably, the constraint conditions of the said step S21 comprises that a cooling capacity directly acting on outer walls of the freezing pipes; a phase transition reaction occurring at a soil mass temperature below $-1°$ C.; the soil mass being considered as mean and isotropic; an initial temperature of the soil mass at each location being the same, and no water in the soil mass migrating.

Preferably, specific steps of step S3 are:
step S31, setting the constraint conditions;
step S32, establishing the geometric model according to the shield tunnel engineering data and carrying out the mesh subdivision;
step S33, selecting the material parameters, determining the load and the boundary condition parameters;
step S34, establishing a water mass conservation equation and an energy conservation equation;
step S35, acquiring the second temperature variation curve of the simulated thermometer holes in the hydro-thermal coupling numerical model corresponding to the actual thermometer holes selected for the temperature variation curves of the thermometer holes.

Preferably, the constraint conditions of step S31 include that the soil mass being a saturated, homogeneous, isotropic and porous medium; a total porosity being constant; an evaporation process of water being neglected; thermal conduction of frozen porous media satisfying Fourier law; and ice being fixed and undeformed.

Preferably, an expression of the water mass conservation equation of the said step S34 is:

$$(1-\varepsilon S_i)S_{OP}\frac{\partial p}{\partial t} + \nabla \cdot [-k_r K \cdot (\nabla p + \rho_w g \nabla D)] = Q_s + Q_T;$$

wherein $S_{OP}$ is a water storage per unit pressure, $S_i$ and p are pressures, $\varepsilon$ is a porosity, t is time, $k_r$ is an effective hydraulic conductivity of a permeability reduction in a water-ice transition region, k is a hydraulic conductivity coefficient, $\rho_w$ is a fluid density, $\nabla D$ is a gravity gradient tensor, $Q_S$ represents source and sink, $Q_T$ represents a temperature-induced mass increase, and its expression is:

$$Q_T = \varepsilon(\rho_w - \rho_i)\frac{\partial S_i}{\partial t};$$

wherein $\rho_i$ is an ice density.

Preferably, an expression of the energy conservation equation of step S34 is:

$$C_{eq}\frac{\partial T}{\partial t} - \nabla(\lambda_{eq}\nabla T) + C_w \vec{u}\nabla T - \rho_w L\frac{\partial S_w}{\partial T} = Q_G;$$

where T is a temperature, $S_w$ is a pore water saturation, $$\frac{\partial S_w}{\partial T}$$

is a volume fraction of water per unit volume of the porous media produced by freezing with the decrease of T, L is a latent heat of the phase transition, $C_w$ is a fluid heat capacity, C is a volume heat capacity, $\lambda$ is a volume thermal conductivity and $\vec{u}$ is a seepage velocity, and its expression is:

$$\vec{u} = -k_r K\left(\frac{\nabla p}{\rho_w g} + \nabla D\right);$$

The subscript eq indicates that physical variables are calculated by a method of volume weighted arithmetic mean, wherein the expressions of $C_{eq}$ and $\lambda_{eq}$ are as follows:

$$C_{eq} = \varepsilon(S_w\rho_w c_w + S_i\rho_i c_i) + (1-\varepsilon)\rho_s c_s;$$

$$\lambda_{eq} = \varepsilon(S_w\eta_w + S_i\eta_i) + (1-\varepsilon)\eta_s;$$

wherein c represents a specific heat capacity, $\eta$ is a coefficient of thermal conductivity, and the subscripts i, w, and s represent ice, water, and particles, respectively.

Preferably, the optimization of the freezing solution in step S5 includes the arrangement of the freezing pipes and change of the diameter of the freezing pipes.

Compared with the prior art, the present invention has the beneficial effects that:

the present invention provides an optimization method of shield tunnel starting end reinforcement solution, which includes: selecting an existing and completed shield tunnel as an optimization object; acquiring engineering data and the temperature variation curves of the thermometer holes in the tunnel; obtaining respectively the first temperature variation curve and the second temperature variation curve by constructing the numerical model with thermal convection and the hydro-thermal coupling numerical model; comparing the temperature variation curves obtained from the two models with temperature variation curves of the actual thermometer holes and obtaining the development of a frozen soil curtain and the influence of seepage on the development law of the temperature field in the current shield tunnel, so as to know the unreasonable parts in the current shield tunnel, and optimize the freezing solution according to the unreasonable parts to prevent the collapse of the shield tunnel and other accidents.

BRIEF DESCRIPTION OF THE FIGURES

In order to more clearly illustrate the technical solutions in embodiments of the present invention, the following text will briefly introduce the drawings needed in the description of the embodiments; obviously, the drawings in the following description are merely the preferred embodiments of the present invention, from which other drawings may be obtained without exerting inventive efforts by those ordinarily skilled in the art.

DETAILED DESCRIPTION OF THE INVENTION

In order to help better understand the technical content of the present invention, a specific embodiment is provided below, and the present invention is further explained in conjunction with the drawings.

The embodiment demonstrates the effectiveness of the present invention by taking Nanjing Heyan Road Yangtze River Express (hereinafter referred to as the river express) as a concrete example.

Figure 1:
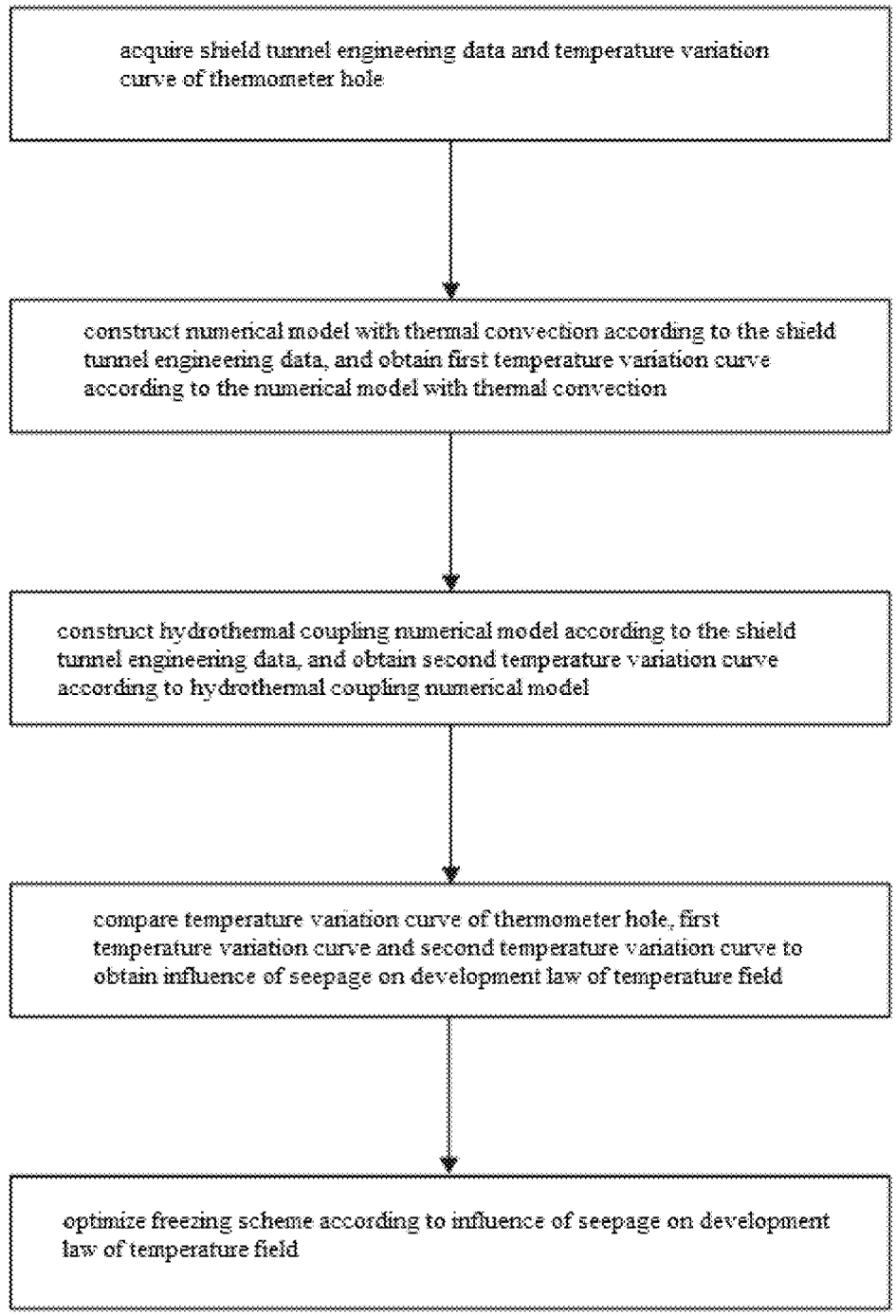
FIG. 1 is a flow chart of an optimization method of shield tunnel starting end reinforcement solution according to the present invention.

Referring to FIG. 1, the present invention provides an optimization method of shield tunnel starting end reinforcement solution, which includes the following steps:
step S1, acquiring shield tunnel engineering data and the temperature variation curves of the thermometer holes;
the shield tunnel engineering data in step S1 includes the arrangement of the freezing pipes, spacing between different rows of the freezing pipes, spacing between the freezing pipe holes in the same row, the distance between the freezing pipes and the diaphragm wall, the diameters and lengths of the freezing pipes, the diameters and lengths of the temperature tubes and depths of the thermometer holes.

The arrangement of the freezing pipes in the river express is that ABC three rows of freezing pipes are vertically arranged with a spacing of 1 m between the vertical freezing pipe rows, wherein the row A of freezing pipes is 0.4 m away from the diaphragm wall, and the freezing pipes are arranged in a flower arrangement manner; the spacing between freezing pipe holes of row A and row B is 0.8 m and the spacing between freezing pipe holes of row C is 1.25 m; the freezing pipes and temperature tubes are 127 mm in diameter and 26.5 m in length; T3 (Path 1), T4 (Path 2) and T5 (Path 3) thermometer holes are selected to acquire the temperature variation curves of the thermometer holes, in which depths of the thermometer holes are −5 m, −8.5 m, −16 m, −23.5 m and −26.5 m in sequence.

Figure 2:
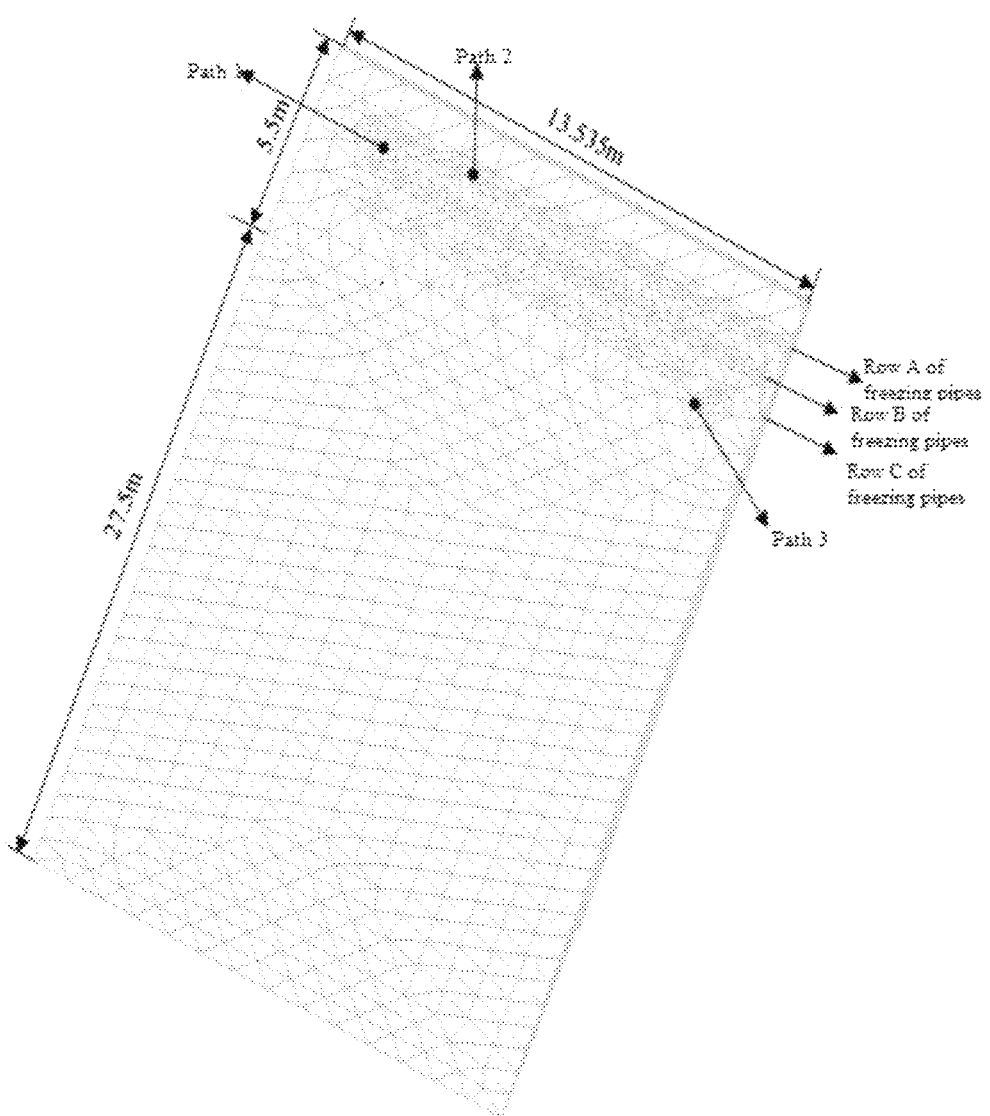
FIG. 2 is a schematic diagram of an overall model of the numerical model with thermal convection.

Step S2, constructing the numerical model with thermal convection according to the shield tunnel engineering data using ADINA Finite Element System, and obtaining the first temperature variation curve according to the numerical model with thermal convection;

The specific steps are as follows:
step S21, setting the constraint conditions;
wherein the constraint conditions include that a cooling capacity loss of hypothermic saline in the freezing pipes being neglected, and the cooling capacity directly acting on the outer walls of the freezing pipes; phase transition reaction (icing) occurring at a soil mass temperature below −1° C.; the soil mass being considered as mean and isotropic; the initial temperature of the soil mass at each location being the same, and setting an original ground temperature to be 37.4° C. in combination with the temperature measured on spot of the river express; neglecting the influence of water migration in the soil mass, and assuming that thermophysical parameters are stable.
step S22, establishing the geometric model according to the shield tunnel engineering data and carrying out the mesh subdivision;
modeling is performed according to the principle of similarity, combined with the on-site construction solution of the river express; according to the arrangement of the freezing pipes, half of the actual project is selected for simulation analysis, wherein the model is 5.5 m in longitudinal direction, 13.535 m in transverse direction, and 27.5 m in vertical direction; the model is composed of two parts, namely, a 1 m thick diaphragm wall and a 4 m thick soil layer; generally, the denser the mesh subdivision of the model, the more units contained in a unit interval, and a higher calculation accuracy. However, excessive units will reduce the computing speed and increase the memory occupation ratio, therefore a moderate mesh subdivision and processing should be carried out. In this model, the flower arrangement mode of three rows of freezing holes is adopted for vertical freezing, in which three thermometer holes are arranged in three rows of freezing pipes, and the positions of thermometer holes are the same as the real-time monitoring directions and sections of the construction site, so as to ensure a comparison between measured and simulated data. Since the soil mass area is considerably large, the boundary mesh density is set to 1 m; the diameters of freezing pipes and temperature tubes are relatively limited, so a mesh density of 0.1 m is set to facilitate the subsequent research on the temperature variation of thermometer holes; this mesh density is designed to reduce the computer calculation on the premise of ensuring the calculation accuracy; the schematic diagram of the model after the mesh subdivision is shown in FIG. 2.

step S23, selecting the material parameters, determining the load and the boundary condition parameters;

Active freezing for 89 days, a model time step is 24 hours, and a total of 89 steps are selected for calculation; combined with the field investigation report and the principle of selecting the most unfavorable soil layer parameters, the parameter selection of the model with thermal convection can be obtained as shown in Table 1:

TABLE 1

Table of parameters selected for the model with thermal convection

| Material type | Density/ (kg · m$^{-3}$) | Coefficient of thermal conductivity W/(m · K) | | Specific heat w/(kg · k) | | latent heat of the phase transition/ (10$^8$ J · m$^{-3}$) | Convective heat transfer coefficient W/(m$^2$ · ° C.) | Radiation coefficient |
|---|---|---|---|---|---|---|---|---|
| | | without breaking ground | breaking ground | without breaking ground | breaking ground | | | |
| Soil mass | 1880 | 1.18 | 1.79 | 1530 | 1610 | 1.20 | — | — |
| C40 concrete | 2450 | 1.8 | | 1080 | | — | 16.49 | 0.94 |

Figure 3:
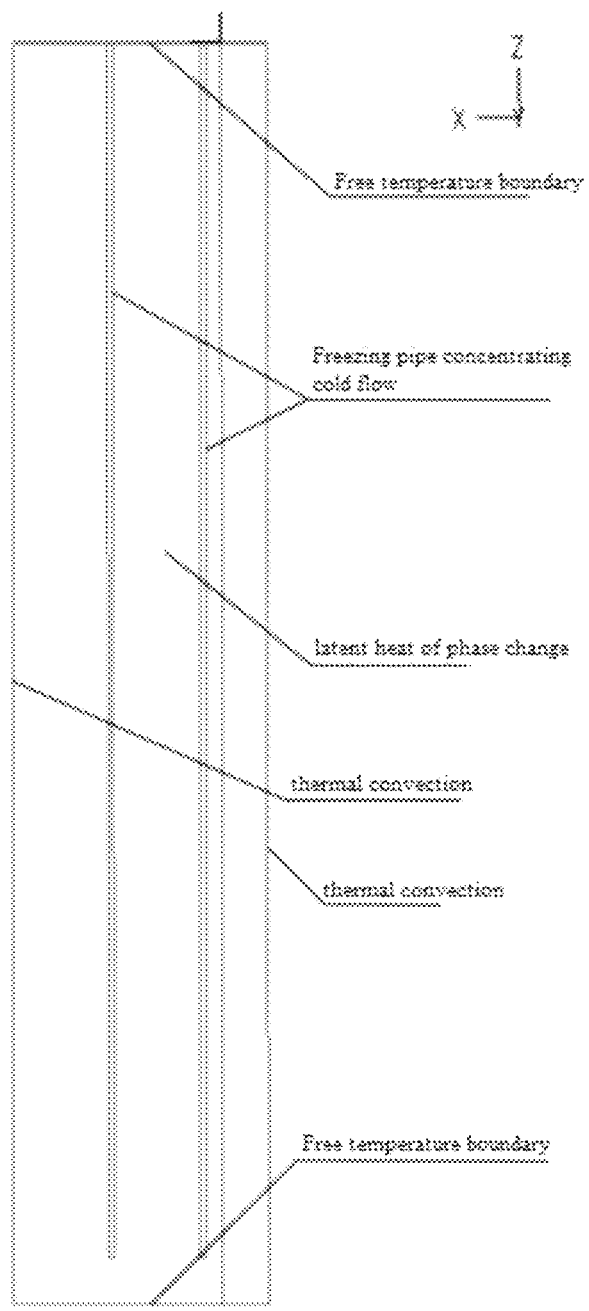
FIG. 3 is a schematic diagram of boundary conditions of the numerical model with thermal convection.

The model boundary is selected as a free temperature boundary, as shown in FIG. 3.

Step S24, acquiring the first temperature variation curve of the simulated thermometer hole in the numerical model with thermal convection corresponding to the actual thermometer hole selected for the temperature variation curve of the thermometer hole.

Figure 4:
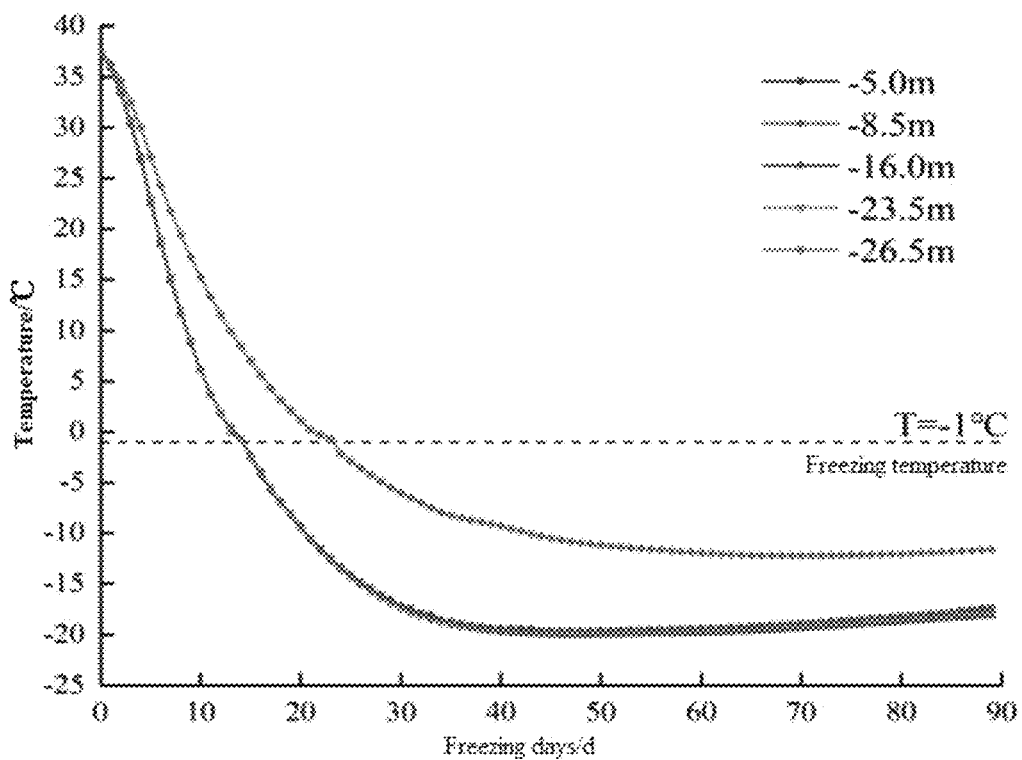
FIG. 4 shows time-temperature variation curves at an analysis point of Path 1 in the numerical model with thermal convection.
Figure 5:
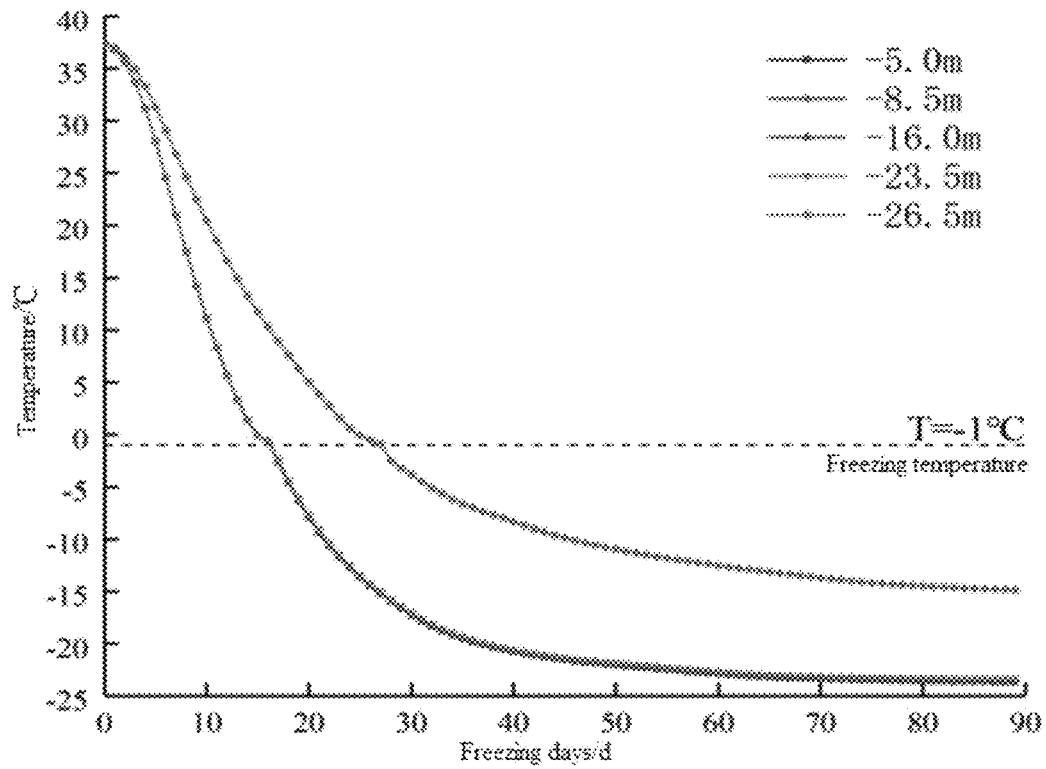
FIG. 5 shows time-temperature variation curves at an analysis point of Path 2 in the numerical model with thermal convection.
Figure 6:
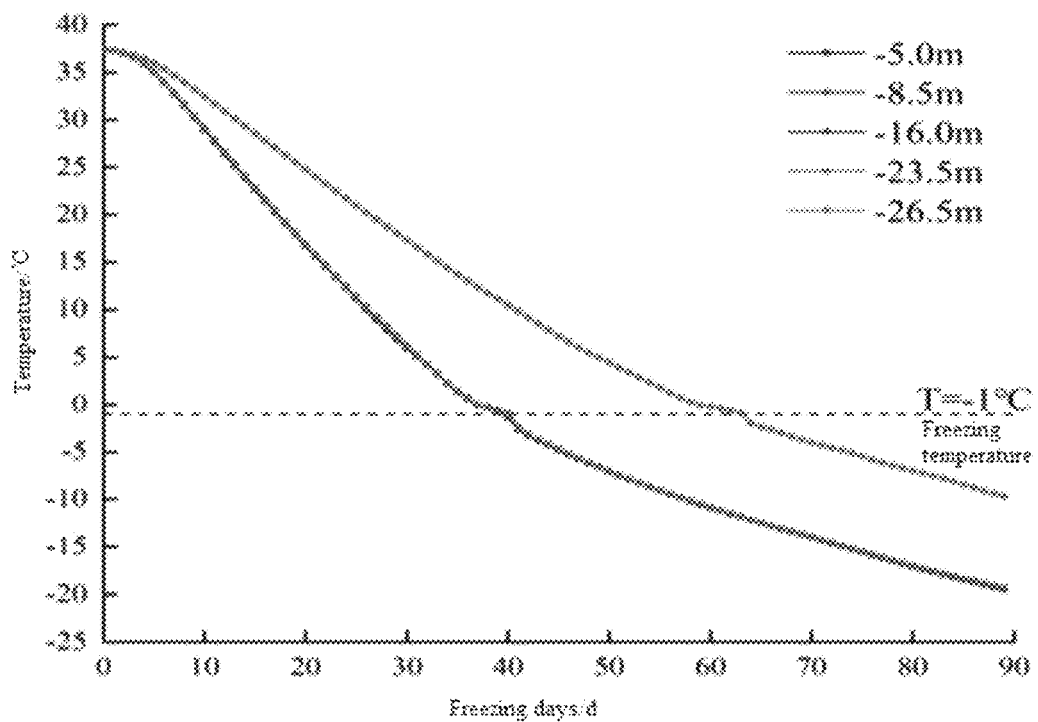
FIG. 6 shows time-temperature variation curves at an analysis point of Path 3 in the numerical model with thermal convection.

To test the correctness of the finite element calculation model, the measured data are compared with the numerical calculation structures with and without thermal convection, and time-temperature variation laws at each temperature measuring point on the three paths are analyzed; FIGS. 4-6 are the time-temperature variation curves at analysis points of the Path 1, the Path 2 and the Path 3 respectively; it can be seen from the drawings that the temperature falling curves of each point can be roughly divided into three stages. At an initial stage of freezing, the soil mass temperature drops the fastest, and after 15 days of active freezing, except for the analysis point at the depth of −26.5 m, the temperatures of the other measuring points all drop to 0° C.; at this time, the freezing period enters the phase transition stage; after the phase transition stage, there is a rapid decline stage, at which time the saline temperature in the freezing pipes is about −28.9° C.; after active freezing for 46 days, the freezing period enters the maintenance stage, and the temperature at the deepest temperature measuring point at −26.5 m drops to −10° C., at this time, the temperature of the saline injected into the freezing pipes gradually drops to −28.9° C., and the soil mass temperature gradually is stabilized.

It is obvious to extract the data of the measuring points on the Path 1 and the Path 2; the measuring point at a depth of −26.5 m is located at the lowest end of the freezing pipe, so the freezing effect is poor and the soil mass temperature drops slowly, and finally stabilizes at −11.6° C. and −14.8° C., which is about 9° C. higher than other measuring points. The temperature at a measuring point of −23.5 m on the Path 1 and the Path 2 drops faster than that at other measuring points in the active freezing stage, which shows that an expansion range of a freezing wall at the measuring point of −23.5 m should be larger than that at other points.

It can be seen from FIG. 6 that the temperature drop rate of each point on this path is slower than that of the temperature measuring points on other paths, and most of the measuring points are finally stable at −19.5° C., while the final stable temperature of the measuring points at the depth of −26.5 m is −9.6° C. The data of the Path 3 show that the outer bottom layer of Row C is the most unfavorable position for the development of the freezing wall.

By comparing with the measured data, it is proved that the numerical model with thermal convection can better simulate the field situation, and by comparing the simulation with and without thermal convection in the model, the influence of the thermal convection on freezing temperature is proved.

Due to the groundwater flow in the field project, it is necessary to explore the influencing factors of freezing reinforcement of the groundwater flow.

Step S3, constructing the hydro-thermal coupling numerical model of the same size according to the shield tunnel engineering data using COMSOL software, and obtaining the second temperature variation curve by observing the process of temperature development and change of a specific temperature measuring point, so as to verify the rationality of the hydro-thermal coupling numerical model in simulating the actual freezing reinforcement engineering construction;

The specific steps are as follows:

step S31, setting the constraint conditions;
the constraint conditions include that the the soil mass being a saturated, homogeneous, isotropic and porous medium, the total porosity being constant; the evaporation process of water being neglected and Darcy's law being applicable to describe the groundwater flow in porous medium; thermal conduction of frozen porous medium satisfying Fourier law; and the ice being fixed and undeformed.

Figure 7:
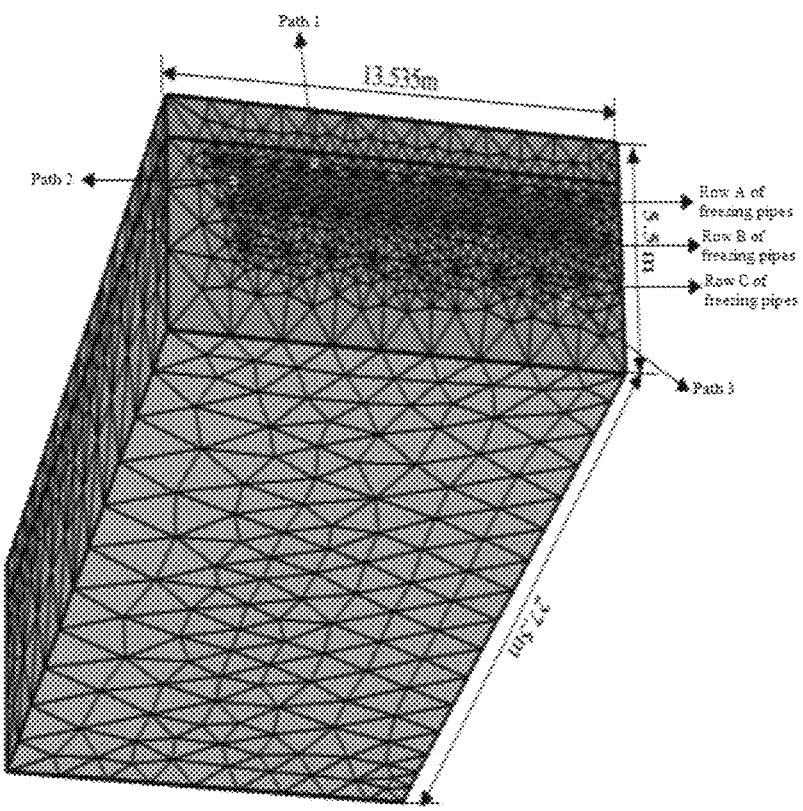
FIG. 7 shows a schematic diagram of an overall model of the hydro-thermal coupling numerical model.

Step S32, establishing the geometric model according to the shield tunnel engineering data and carrying out the mesh subdivision;
establish the numerical model according to the site construction solution, and keep the parameters consistent with that of the numerical model with thermal convection established in step S2, so as to facilitate subsequent comparison, wherein the model is 5.5 m in longitudinal direction, 13.535 m in transverse direction, and 27.5 m in vertical direction; the model is composed of two parts, namely, a 1 m thick diaphragm wall and a 4 m thick soil layer; T3 (Path 1), T4 (Path 2) and T5 (Path 3) thermometer holes are selected to acquire the temperature variation curves of the thermometer holes, in which depths of the thermometer holes are −5 m, −8.5 m, −16 m, −23.5 m and −26.5 m in sequence, the mesh subdivision is carried out by free tetrahedron combined with sweeping, in order to reduce the calculation accuracy and solution time, the number of soil layer units is reduced, and number of the freezing pipes is increased, by which effective results are better obtained; the mesh subdivision is shown in FIG. 7.

Step S33, selecting the material parameters, determining the load and the boundary condition parameters;
actively freezing for 89 days; the model time step is 24 hours and a total of 89 steps are selected for calculation; combined with the weather conditions, the end soil mass has been reinforced by mixing piles; according to the measured data, the initial temperature of the model soil mass is finally selected as 37.4° C., and combined with the field investigation report, the model physical parameters can be obtained as shown in Table 2:

TABLE 2

Table of the model physical parameters selected for the hydro-thermal coupling numerical model:

| Parameter | Numerical value |
| --- | --- |
| Soil mass density (kg/m$^3$) | 1800 |
| Water density (kg/m$^3$) | 1000 |
| Ice density (kg/m$^3$) | 920 |
| Seepage velocity (m/d) | 0.6 |
| Heat conduction coefficient of soil mass W/(m · K) | 1.18 |
| Heat conduction coefficient of water W/(m · K) | 0.6 |
| Heat conduction coefficient of ice W/(m · K) | 2.14 |
| Specific heat capacity of soil (J/(kg · K)) | 1530 |
| Specific heat capacity of water (J/(kg · K)) | 4200 |
| Specific heat capacity of ice (J/(kg · K)) | 2100 |
| Porosity | 0.4 |
| Latent heat (J/kg) | 337,720 |

Figure 8:
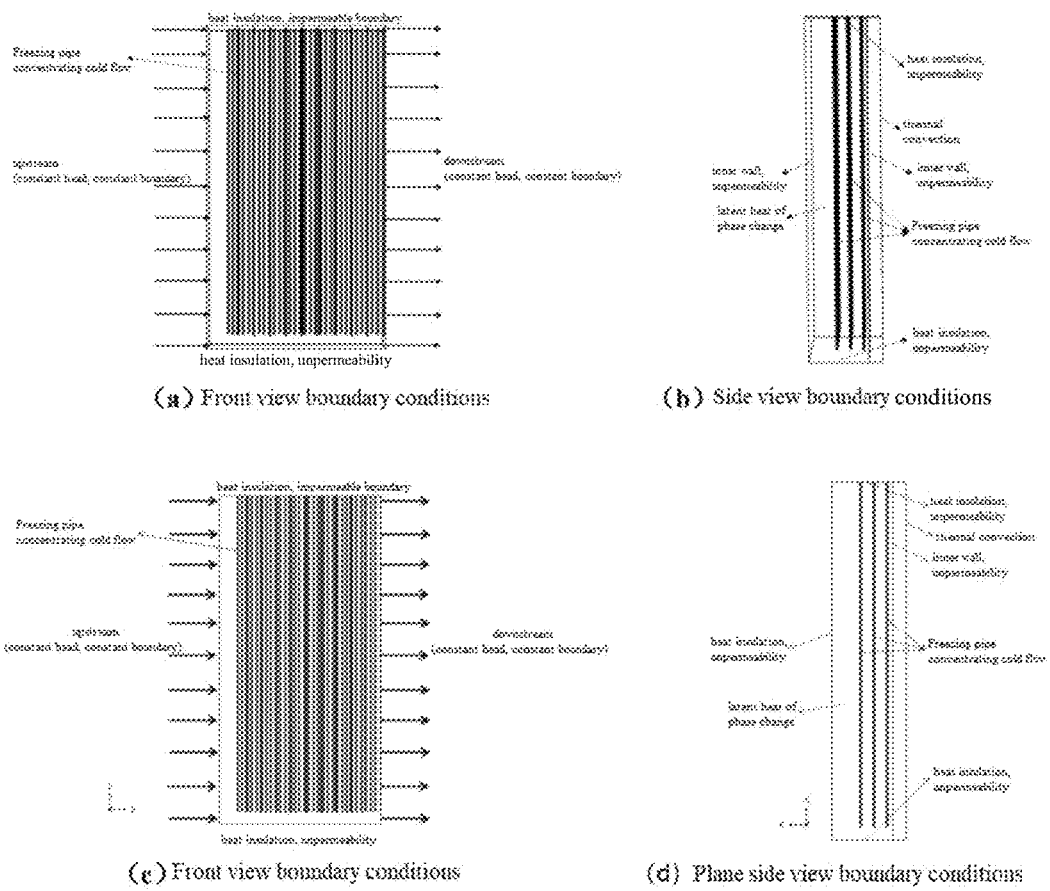
FIG. 8 shows a schematic diagram of boundary conditions of the hydro-thermal coupling numerical model.

Except that the upstream and downstream boundaries of seepage are constant temperature boundaries (the initial ground temperature is 37.4° C.), the contact surface between diaphragm wall and air is a heat exchange boundary; the boundaries on both sides of the model are permeable boundaries; the seepage velocity is 0.6 m/d, and the seepage field is uniform and stable in the sand layer, while the other surfaces are impermeable boundaries; the schematic diagram of boundary conditions is shown in FIG. 8.

Step S4, establishing the water mass conservation equation and the energy conservation equation;
due to the blocking effect of ice, the mass transfer of water is inevitably affected by temperature-controlled crystallization; secondly, the water-ice phase transition will be accompanied by the density change between liquid and solid, resulting in a mass loss; therefore, the conservation of total water can be expressed by Darcy's law, and the expression of the ice-water mass conservation equation is specifically as follows:

$$(1-\varepsilon S_i)S_{OP}\frac{\partial p}{\partial t} + \nabla[-k_r K \cdot (\nabla p + \rho_w g \nabla D)] = Q_S + Q_T;$$

wherein $S_{OP}$ is the water storage per unit pressure, $S_i$ and p are the pressures, $\varepsilon$ is the porosity, t is time, $k_r$ is the effective water conductivity of permeability reduction in the water-ice phase transition zone, k is the water conductivity coefficient, $\rho_w$ is the fluid density, $\nabla D$ is the gravity gradient tensor, $Q_S$ represents the source and the sink, $Q_T$ represents the temperature-induced mass increase, and its expression is:

$$Q_T = \varepsilon(\rho_w - \rho_i)\frac{\partial S_i}{\partial t};$$

wherein $\rho_i$ is the ice density.

Due to the flow of groundwater, convective heat transfer can not be ignored; the higher the velocity of groundwater, the stronger the influence of the groundwater on heat transfer; in addition, in this case, the heat transfer includes the process of water-ice phase transition, which causes severe energy transfer in a narrow phase transition range; therefore, except heat conduction, the energy conservation equation should also include the thermal convection and the phase transition; the expression of the energy conservation equation is:

$$C_{eq}\frac{\partial T}{\partial t} - \nabla(\lambda_{eq}\nabla T) + C_w \vec{u}\nabla T - \rho_w L\frac{\partial S_w}{\partial T} = Q_G;$$

wherein T is the temperature, $S_w$ is the pore water saturation, $$\frac{\partial S_w}{\partial T}$$

is the volume fraction of water per unit volume of the porous media produced by freezing with the decrease of T, L is the latent heat of the phase transition, $C_w$ is the fluid heat capacity, C the a volume heat capacity, $\lambda$ is the volume thermal conductivity and $\vec{u}$ is the seepage velocity; according to Darcy's Law, its expression is:

$$\vec{u} = -k_r K\left(\frac{\nabla p}{\rho_w g} + \nabla D\right);$$

The subscript eq indicates that the physical variables are calculated by a method of volume weighted arithmetic mean, wherein the expressions of $C_{eq}$ and $\lambda_{eq}$ are as follows:

$$C_{eq} = \varepsilon(S_w\rho_w c_w + S_i\rho_i c_i) + (1-\varepsilon)\rho_s c_s;$$

$$\lambda_{eq} = \varepsilon(S_w\eta_w + S_i\eta_i) + (1-\varepsilon)\eta_s;$$

wherein c represents a specific heat capacity, $\lambda$ is the heat conduction coefficient, and the subscripts i, w, and s represent the ice, the water, and the particles respectively.

step S35, acquiring the second temperature variation curve of the simulated thermometer holes in the hydro-thermal coupling numerical model corresponding to the actual thermometer holes selected for the temperature variation curve of the thermometer holes.

Figure 9:
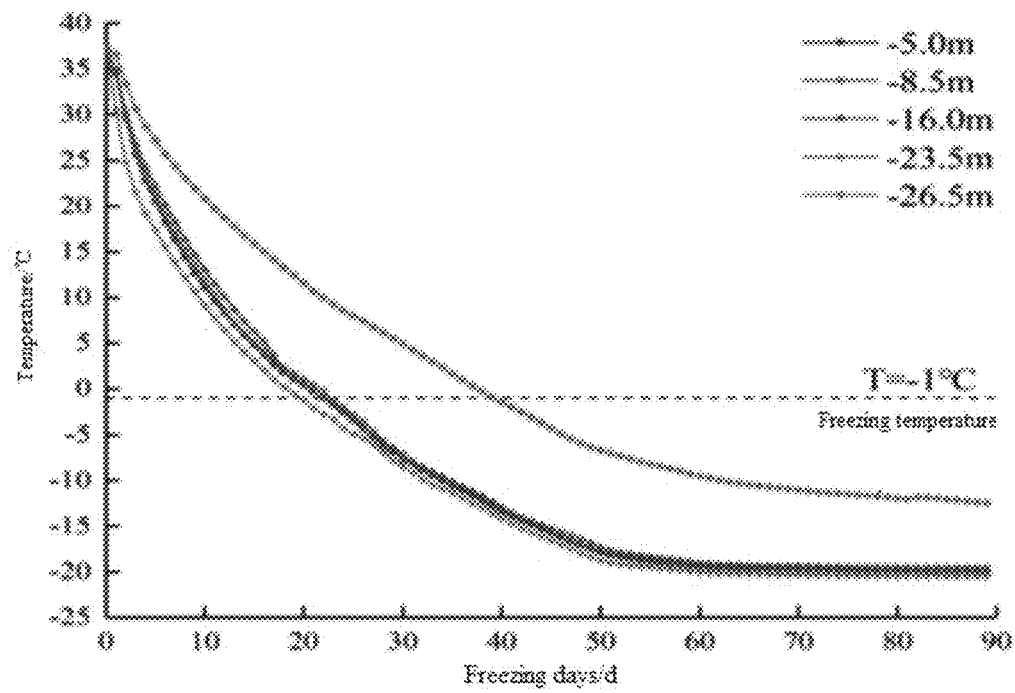
FIG. 9 shows the time-temperature variation curve at an analysis point of the Path 1 in the hydro-thermal coupling numerical model.
Figure 10:
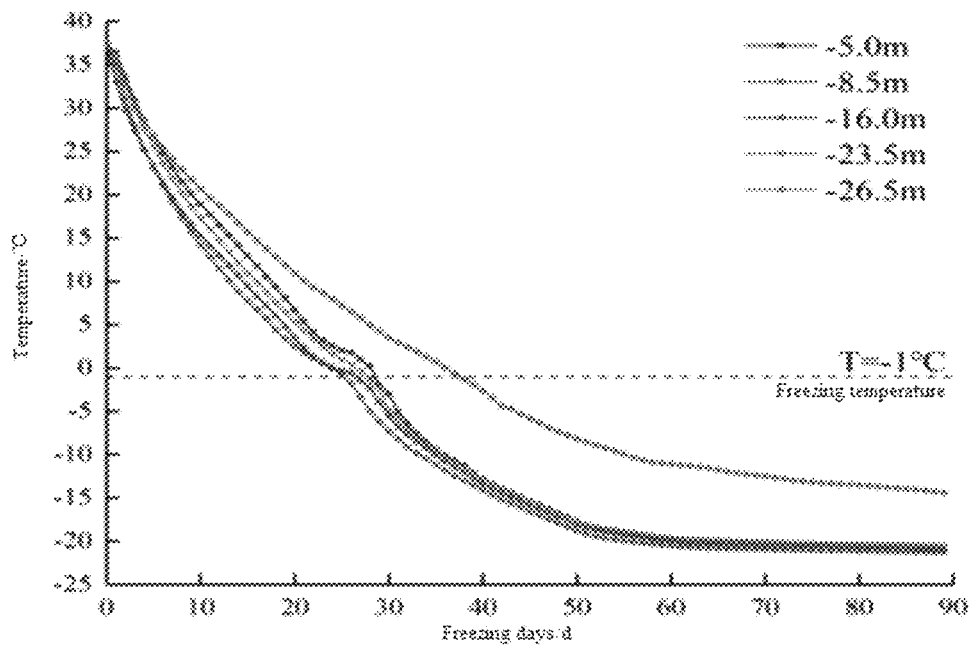
FIG. 10 shows the time-temperature variation curves at an analysis point of the Path 2 in the hydro-thermal coupling numerical model.
Figure 11:
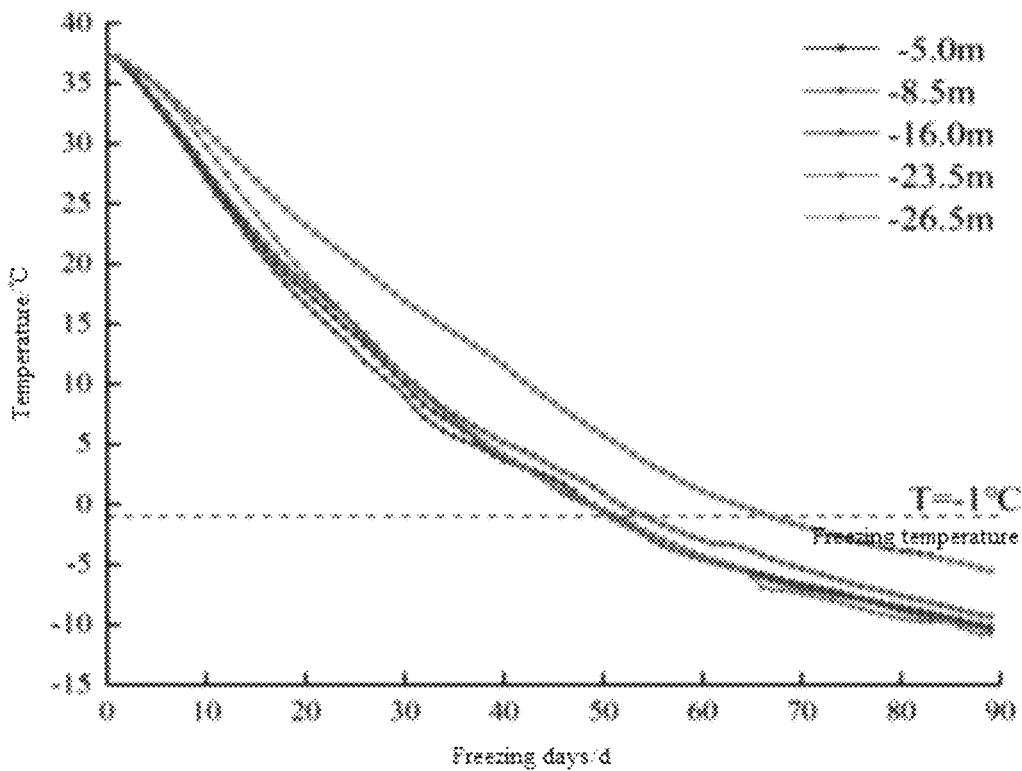
FIG. 11 shows the time-temperature variation curves at an analysis point of the Path 3 in the hydro-thermal coupling numerical model.

The hydro-thermal coupling numerical model selects the same temperature measuring points and the Paths as that of the numerical model with thermal convection; through calculation and analysis, the time-temperature variation curves of each temperature measuring point on different Paths as shown in FIGS. 9-11 can be obtained; it is seen from FIGS. 9-11 that the Path 1 and the Path 2 are located inside the freezing zone, and the initial temperature of the soil mass is designed to be 37.4° C.; the freezing curves can be roughly divided into three stages: at the initial stage of freezing, the temperature of the soil mass drops the fastest; after actively freezing for 27 days, all measuring points except the measure point at a depth of −26.5 m drop below 0° C.; at this time, the freezing period enters the second stage, namely, the phase transition stage, in which a freezing curvature slows down, and the freezing temperature continues to drop; then it drops to −10° C. on the 36th day; on the $52^{nd}$ day of the active freezing, the freezing period enters the maintenance stage in which the temperature at the deepest depth of −26.5 m drops to −8° C.; the saline temperature also gradually changes to −28.9° C.; the soil mass temperature is gradually stabilized; the temperature at the depth of −26.5 m in the Path 1 is stabilized at −12.4° C.; the temperatures at other measuring points are stabilized at about 20.2° C.; the lowest temperature is remained at about 20.5° C. and the trends of the temperature variation of the temperature measuring points on the Path 1 and the Path 2 are basically the same.

According to the data of the measuring points on the Path 1 and the Path 2, it is known that the depth of −26.5 m is already located at the edge of frozen soil curtain, the freezing range of the freezing pipes on the soil mass below is limited, and the temperature drop rate of the soil mass is obviously slower than that of all other measuring points; except for that of the measuring point at the depth of −26.5 m, the temperature variation curves of the rest of the depths are basically the same, and the temperature difference is less than 0.5° C.

Figure 12:
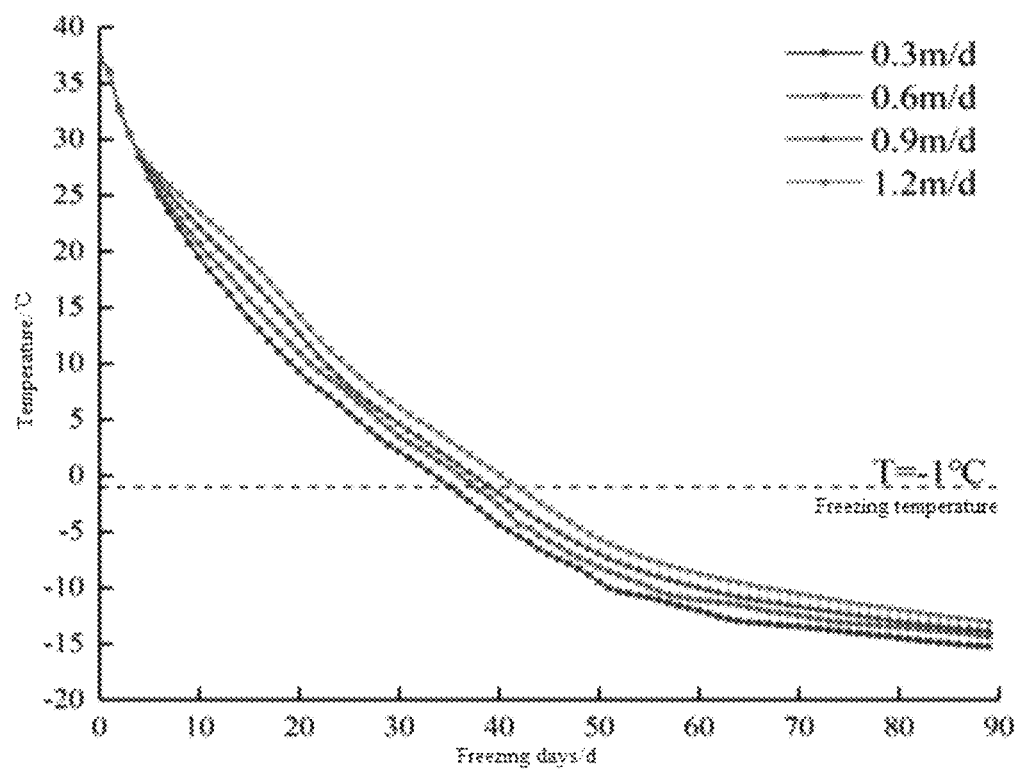
FIG. 12 is a temperature variation curve graph of the Path 2 under different seepage velocities in the hydro-thermal coupling numerical model.
Figure 13:
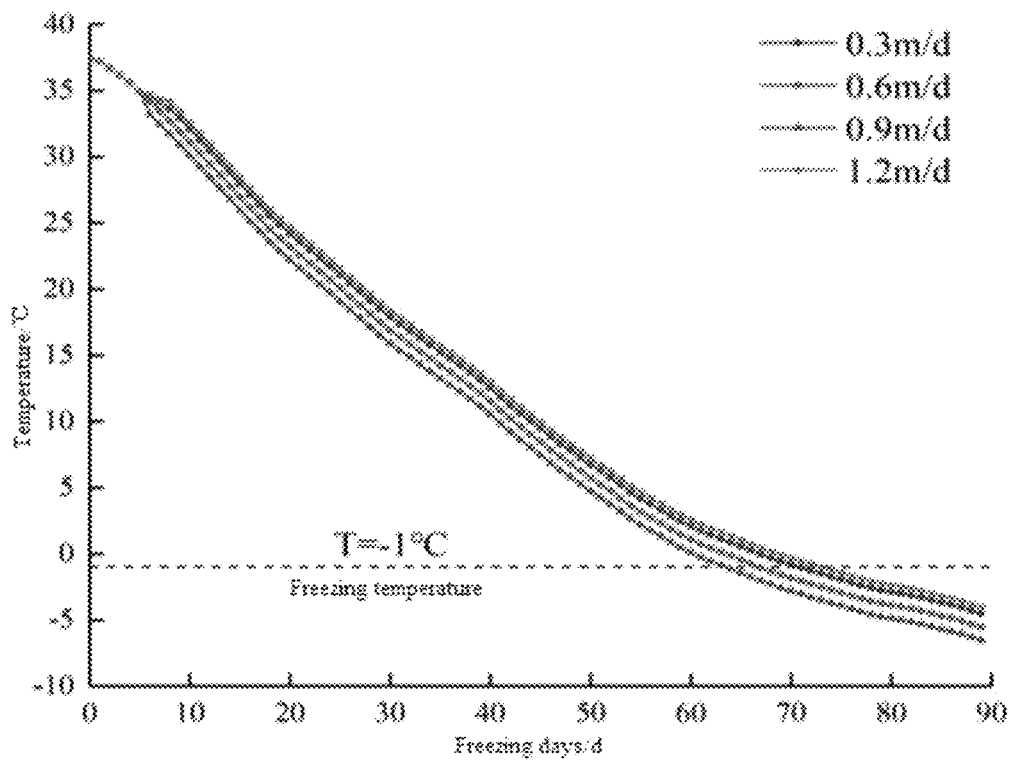
FIG. 13 is a temperature variation curve graph of the Path 3 under different seepage velocities in the hydro-thermal coupling numerical model.

The Path 3 is located at the back side of Row C of freezing pipes and also at the edge of frozen soil curtain; the falling rate and trend of temperature dropping curve are completely different from that of the other thermometer holes, and the freezing temperature at each point in the later period reaches about −10° C. except that of the point at the depth of −26.5 m; groundwater flow will take away the cooling capacity emitted by the freezing pipes and continuously transmit it to the direction of low head; as the groundwater flow in the soil mass continuously passes through this zone, when the groundwater passes through the Path 3, the cooling capacity of groundwater is continuously transmitted due to the temperature difference; in addition to the influence of active freezing of the freezing pipes, the temperature at this thermometer holes meets the requirements of enhancing strength of the soil mass and sealing water.

step S4, comparing the temperature variation curve of the thermometer holes, the first temperature variation curve and the second temperature variation curve to obtain the influence of seepage on the development law of the temperature field;

Through the hydro-thermal coupling numerical model, the Path 2 and the Path 3 are monitored under different seepage velocities at the depth of −26.5 to obtain the corresponding temperature variation curves shown in FIGS. 12 and 13; according to the analysis, the Path 1 is between Row A and the diaphragm wall, and the groundwater flow has little influence in the later formation stage of the freezing walls, so only the Path 2 and the Path 3 are selected for discussion; the path 2 is near the water head, and the Path 3 is outside the Row C of freezing pipes, so the influence of groundwater flow is greater and intuitive; a Z=−26.5 in measuring point is the measuring point with poor freezing effect, and the analysis of the worst freezing effect can better explain the situation.

In actual engineering, the seepage velocity is 0.6 m/d, and the seepage velocities of 0.3 m/d, 0.9 m/d and 1.2 m/d are preferably selected for discussion and research; it can be seen from the drawings that the greater the seepage velocity, the slower the curve decline rate and the higher the final freezing temperature; it can be seen by observing the days when the temperature reaches the freezing temperature of −1° C. that it takes 34 days when the flow rate is 0.3 m/d, but 41 days when the flow rate is 1.2 m/d, and the time required for icing increases as the flow rate increases.

The temperature variation curves of the Path 3 are relatively concentrated; the Path 3 is outside Row C of freezing pipes and is affected by the freezing of the freezing pipes and the groundwater flow, so the freezing effect is poor; according to the curve form, the temperature falling rate from fast to slow is 0.9 m/d, 0.6 m/d, 0.3 m/d, 1.2 m/d respectively; it can be seen that according to the field engineering situation and freezing arrangement, the cooling capacity transferred to the Path 3 at the flow rate of 0.9 m/d is greater than which is taken away by water flow from the Path 3, resulting in such a phenomenon, that is, the cooling capacity carried away from the Path 3 at the flow rate of 1.2 m/d is greater than a carrying capacity at other flow rates, so the temperature is higher.

According to the above analysis, the greater the seepage velocity in the freezing zone, the worse the freezing effect; the smaller the seepage velocity, the better the freezing effect; on the outside of the freezing zone, the freezing effect depends on the comparison of amount between the cooling capacities brought and carried away which are decided by the seepage velocity; the groundwater flow has a great influence on the actual engineering, and water leakage, sand leakage and collapse are easy to occur without prevention and control.

Step S5, optimizing the freezing solution according to the influence of seepage on the development law of the temperature field, including optimizing the arrangement of the freezing pipes and the change of the diameter of the freezing pipes.

When the freezing solution is optimized according to the influence of seepage on the development law of the temperature field, it is necessary to redesign the arrangement and diameters of the freezing pipes, and keep geologic conditions and boundary loads unchanged, so as to optimize the freezing solution of the river express; according to the above analysis, the main ideas for optimizing the freezing solution of Nanjing Heyan Road Yangtze River Express are as follows: arranging rows of densified freezing pipes in the upstream of the groundwater, the freezing wall is formed by the upstream freezing pipes, which reduces the amount of cooling capacity carried away by water flow; reducing the number of freezing pipe rows and expanding the row spacing in engineering.

Figure 14:
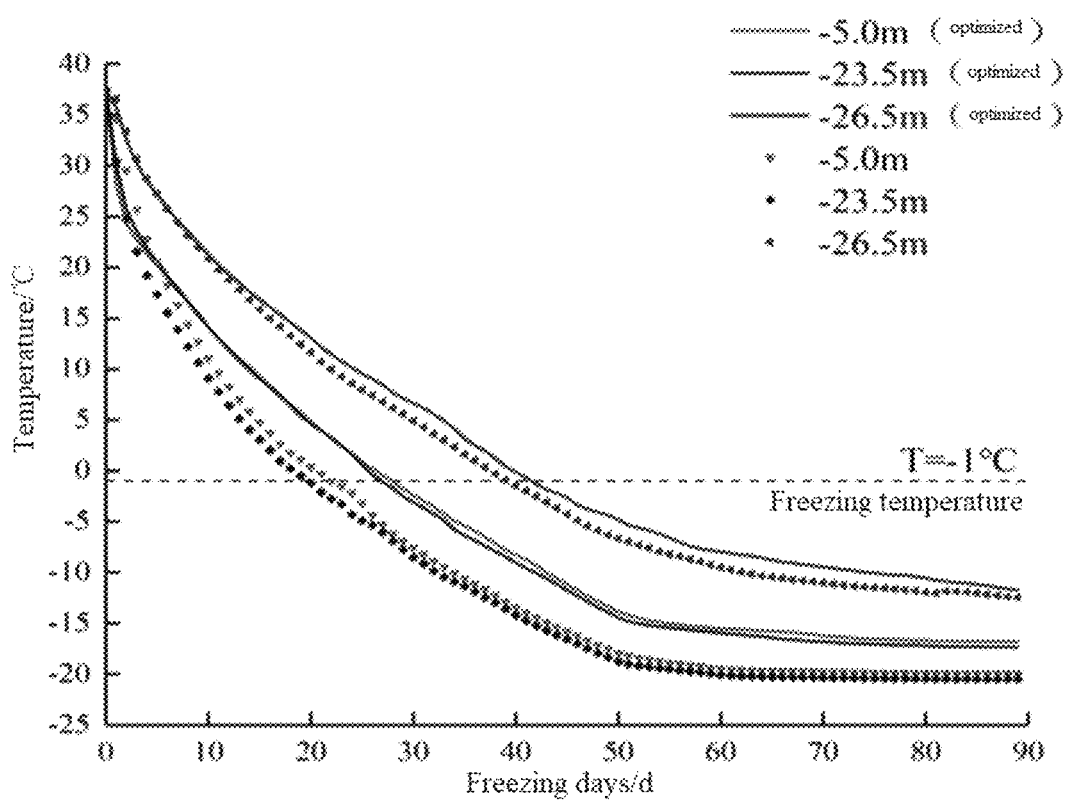
FIG. 14 is a comparison diagram of temperature variation curves of the the Path 1 before and after the freezing solution optimization.
Figure 15:
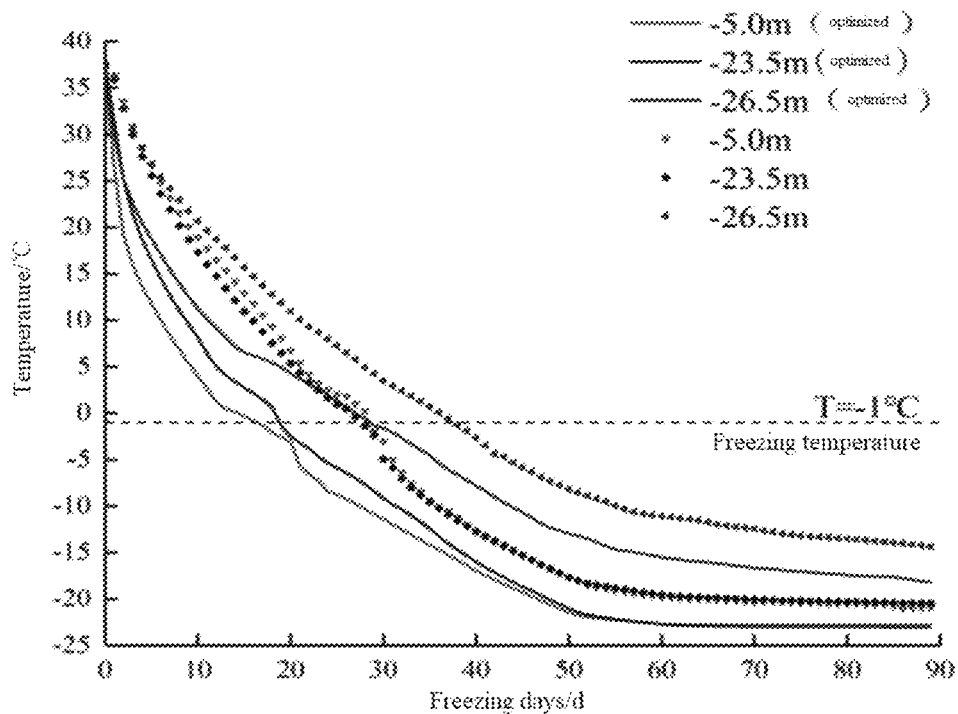
FIG. 15 is a comparison diagram of temperature variation curves of the the Path 2 before and after the freezing solution optimization.
Figure 16:
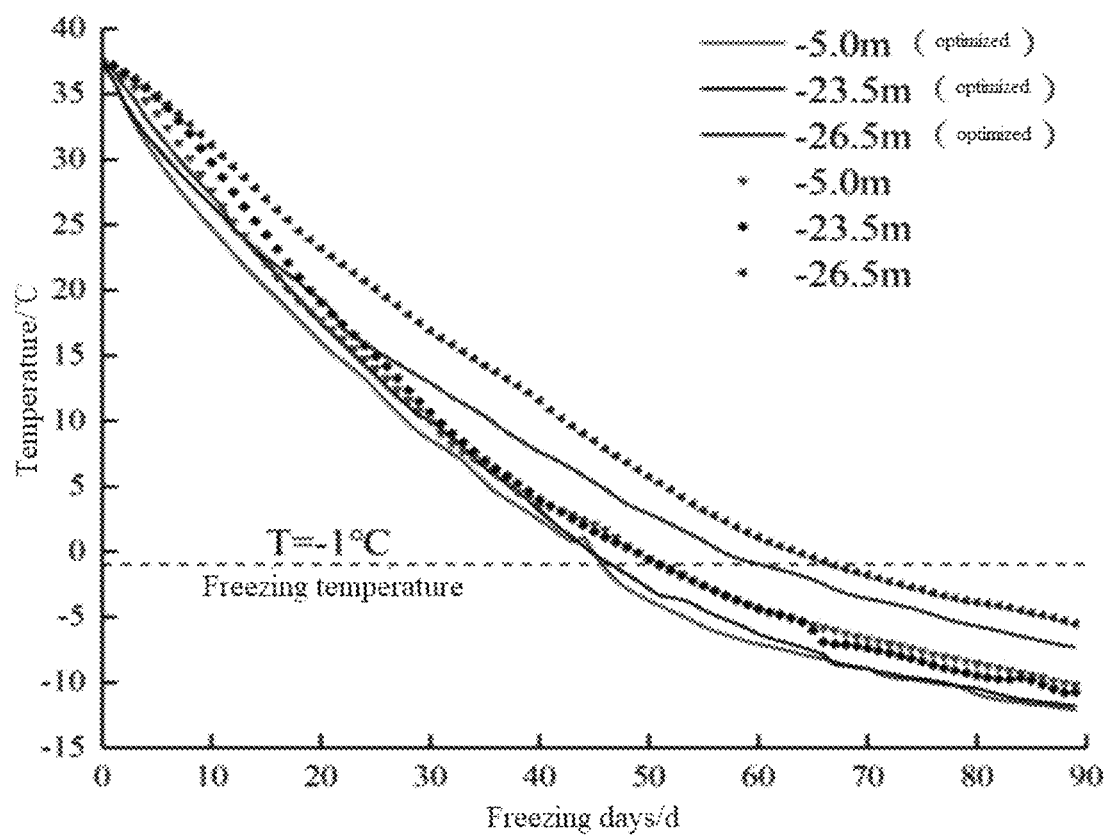
FIG. 16 is a comparison diagram of temperature variation curves of the the Path 3 before and after the freezing solution optimization.

After adopting the freezing solution, the temperature variation curves of the three optimized paths at depths of −5 m, −23.5 m and −26.5 m are acquired, and as compared with the temperature variation curves before optimization, a comparison diagram of the temperature variation curves of the three paths before and after the freezing solution optimization as shown in FIGS. 14-16 is obtained; As is shown in FIG. 14, at the same depth, the freezing curves of the original freezing solution drop faster, and the final freezing temperatures are slightly lower; in the two freezing solutions, the freezing temperature at the measuring point at the depth of −23.5 m drops the fastest and to the lowest; the Row A of freezing pipes in the original freezing solution is close to the Path 1, and its cooling effect is obvious; the optimized solution brings poor cooling effect; compared with the original freezing solution, the final freezing temperature at the depths of −5.0 m and −23.5 m has a temperature difference of about 2° C., and the temperature difference at the depth of −26.5 m is only −0.5° C.

As is seen from FIG. 15, in the the original freezing solution, the spacing between Path 2 and Row A as well as the Path 2 and Row B of freezing pipes are not great; in the optimized solution, Row A of freezing pipes is close to the Path 2, while Row B of freezing pipes is far away from the Path 2. After optimization, the freezing temperature curve drops faster and the final freezing temperature is lower; after optimization, the time when the temperature drops to 0° C. is advanced by 14, 8 and 9 days respectively, and the final freezing temperatures are −22.8° C., −22.9° C. and −18.1° C. respectively, and the lowest final freezing temperature is at the depth of −23.5 m.

As is seen from FIG. 16, in the original freezing solution, the Path 3 is outside Row C of freezing pipes, and in the optimized solution is outside Row B of freezing pipes. After optimization, the temperature falling curve of the Path 3 drops the faster and the final freezing temperature is lower, but cooling extents of the original freezing solution and the optimized solution are limited, and the final freezing temperature is not much different; after optimization, the temperature drops to −1° C. in advance, and the freezing effect is better.

To sum up, after the optimization of the freezing solution, the freezing effect of the Path 2 and the Path 3 is better, and the freezing effect of the Path 1 of the original solution is better, but the freezing effect of the optimized solution in the Path 1 is not much different from that of the original solution, which can meet the construction requirements.

The above statements are merely the better embodiments of the present invention and are not intended to limit the present invention. Any modification, equivalent replacement, improvement, etc. made within the spirit and principles of the present invention should be included in the scope of protection of the present invention.

The invention claimed is:

1. An optimization method of shield tunnel starting end reinforcement solution based on construction requirements, comprising the steps of:
   step S1, acquiring shield tunnel engineering data and temperature variation curves of temperature measuring holes;
   constructing a numerical model with thermal convection according to the shield tunnel engineering data, and obtaining a first temperature variation curve according to the numerical model with thermal convection;
   constructing a hydro-thermal coupling numerical model according to the shield tunnel engineering data, and obtaining a second temperature variation curve according to the hydro-thermal coupling numerical model, by setting the constraint conditions, whereby the constraint conditions comprises that the soil mass being a saturated, homogeneous, isotropic and porous medium; a total porosity being constant; an evaporation process of water being neglected; a thermal conduction of frozen porous media satisfying Fourier law; and ice being fixed and undeformed; establishing the geometric model according to the shield tunnel engineering data and carrying out the mesh subdivision; selecting material parameters, determining the load and the boundary condition parameters; establishing a water mass conservation equation and an energy conservation equation; and by acquiring the second temperature variation curve of the simulated temperature measuring holes in the hydro-thermal coupling numerical model corresponding to the actual temperature measuring holes selected for the temperature variation curves of the temperature measuring holes;

comparing the temperature variation curves of the temperature measuring holes, the first temperature variation curve and the second temperature variation curve to obtain an influence of seepage on the development law of a temperature field; and optimizing a freezing scheme according to the influence of the seepage on the development law of the temperature field to prevent the collapse of the shield tunnel.

2. The optimization method of the shield tunnel starting end reinforcement solution according to the claim 1, wherein the shield tunnel engineering data comprises an arrangement of freezing pipes, spacing between different rows of freezing pipes, spacing between freezing pipe holes in the same row, distances between the freezing pipes and diaphragm walls, diameters and lengths of the freezing pipes, diameters and lengths of temperature tubes and depths of the temperature measuring holes.

3. The optimization method of the shield tunnel starting end reinforcement solution according to the claim 1, wherein the numerical model with thermal convection according to the shield tunnel engineering data comprises setting constraint conditions;

establishing a geometric model according to the shield tunnel engineering data and carrying out a mesh subdivision;

selecting material parameters, determining load and boundary condition parameters; and acquiring the first temperature variation curve of simulated temperature measuring holes in the numerical model with thermal convection corresponding to actual temperature measuring holes selected for the temperature variation curves of the temperature measuring holes.

4. The optimization method of the shield tunnel starting end reinforcement solution according to the claim 3, wherein the constraint conditions comprises that a cooling capacity directly acting on outer walls of freezing pipes; a phase transition reaction occurring at a soil mass temperature below −1° C.; the soil mass being considered as mean and isotropic; and an initial temperature of the soil mass at each location being the same, and no water in the soil mass migrating.

5. The optimization method of the shield tunnel starting end reinforcement solution according to the claim 1, wherein an expression of the water mass conservation equation is:

$$(1-\varepsilon S_i)S_{OP}\frac{\partial p}{\partial t} + \nabla[-k_r K\bullet(\nabla p + \rho_w g \nabla D)] = Q_S + Q_T;$$

wherein $S_{OP}$ is a water storage per unit pressure, $S_i$ and p are pressures, $\varepsilon$ is a porosity, t is time, $k_r$ is an effective hydraulic conductivity of permeability reduction in a water-ice transition region, k is a hydraulic conductivity coefficient, $\rho_w$ is a fluid density, $\nabla D$ is a gravity gradient tensor, $Q_S$ represents source and sink, $Q_T$ represents a temperature-induced mass increase, and its expression is:

$$Q_T = \varepsilon(\rho_w - \rho_i)\frac{\partial S_i}{\partial t}$$

wherein $\rho_i$ is an ice density.

6. The optimization method of the shield tunnel starting end reinforcement solution according to the claim 5, wherein an expression of the energy conservation equation is:

$$C_{eq}\frac{\partial T}{\partial t} - \nabla(\lambda_{eq}\nabla T) + C_w \vec{u}\nabla T - \rho_w L \frac{\partial S_w}{\partial T} = Q_G;$$

where T is temperature, $S_w$ is a pore water saturation, $$\frac{\partial S_w}{\partial T}$$

is a volume fraction of water per unit volume of the porous media produced by freezing with the decrease of T, L is a latent heat of the phase transition, $C_w$ is a fluid heat capacity, C is a volume heat capacity, $\lambda$ is a volume thermal conductivity and $\vec{u}$ is a seepage velocity, and its expression is:

$$\vec{u} = -k_r K\left(\frac{\nabla p}{\rho_w g} + \nabla D\right);$$

The subscript eq indicates that physical variables are calculated by a method of volume weighted arithmetic mean, wherein the expressions of $C_{eq}$ and $\lambda_{eq}$ are as follows:

$$C_{eq} = \varepsilon(S_w \rho_w c_w + S_i \rho_i c_i) + (1-\varepsilon)\rho_s c_s;$$

$$\lambda_{eq} = \varepsilon(S_w \eta_w + S_i \eta_i) + (1-\varepsilon)\eta_s;$$

wherein c represents a specific heat capacity, $\eta$ is a heat conduction coefficient, and the subscripts i, w, and s represent ice, water, and particles respectively.

7. The optimization method of the shield tunnel starting end reinforcement solution according to the claim 2, wherein the optimization of the freezing scheme comprises changes of the arrangement of the freezing pipes as well as the diameters of the freezing pipes.

* * * * *